(12) United States Patent
Shima et al.

(10) Patent No.: US 7,570,344 B2
(45) Date of Patent: Aug. 4, 2009

(54) EXPOSURE APPARATUS AND DEVICE MANUFACTURING METHOD

(75) Inventors: Shinichi Shima, Utsunomiya (JP); Yasuo Takama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/052,086

(22) Filed: Mar. 20, 2008

(65) Prior Publication Data
US 2008/0246938 A1 Oct. 9, 2008

(30) Foreign Application Priority Data
Apr. 3, 2007 (JP) ............... 2007-097629

(51) Int. Cl.
G03B 27/42 (2006.01)
G03B 27/52 (2006.01)
(52) U.S. Cl. .......................... 355/53; 355/55
(58) Field of Classification Search .................. 355/52, 355/53, 55, 67–71; 356/399–401; 250/548
See application file for complete search history.

(56) References Cited

U.S. PATENT DOCUMENTS

| 5,760,879 | A | 6/1998 | Shinonaga et al. |
| 7,221,431 | B2 | 5/2007 | Ohsaki |
| 7,388,649 | B2 * | 6/2008 | Kobayashi et al. ............ 355/53 |
| 2002/0061469 | A1 | 5/2002 | Tanaka |

FOREIGN PATENT DOCUMENTS

| JP | 08-022951 A | 1/1996 |
| JP | 11-016816 A | 1/1999 |
| JP | 2005-019864 A | 1/2005 |
| JP | 2005-116570 A | 4/2005 |
| JP | 2005-175034 A | 6/2005 |
| JP | 2005-191557 A | 7/2005 |

* cited by examiner

Primary Examiner—Hung Henry Nguyen
(74) Attorney, Agent, or Firm—Canon USA Inc IP Division

(57) ABSTRACT

An exposure apparatus which exposes a substrate via a liquid, comprises: a projection optical system configured to project a pattern of a reticle onto the substrate; a substrate stage configured to hold the substrate and move; a top plate which is arranged on the substrate stage and in which an opening is formed; and a measurement member which is arranged in the opening formed in the top plate arranged on the substrate stage, wherein a gap is formed between the top plate and the measurement member in a plane perpendicular to an optical axis of the projection optical system, and wherein the exposure apparatus satisfies the following formula: $\gamma \cdot \cos\theta_1 \cdot L_1 + \gamma \cdot \cos\theta_2 \cdot L_2 + Pf \cdot S < 0$.

2 Claims, 12 Drawing Sheets

F I G. 2
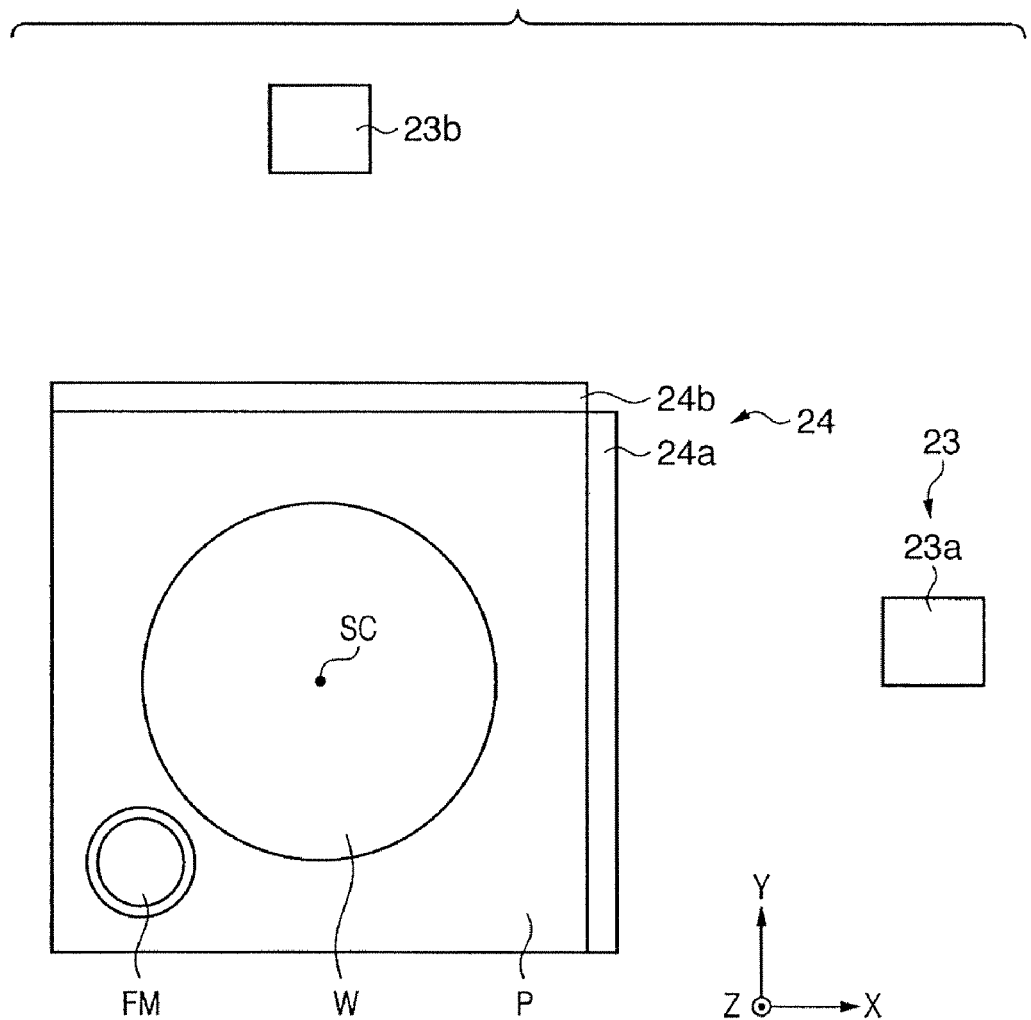

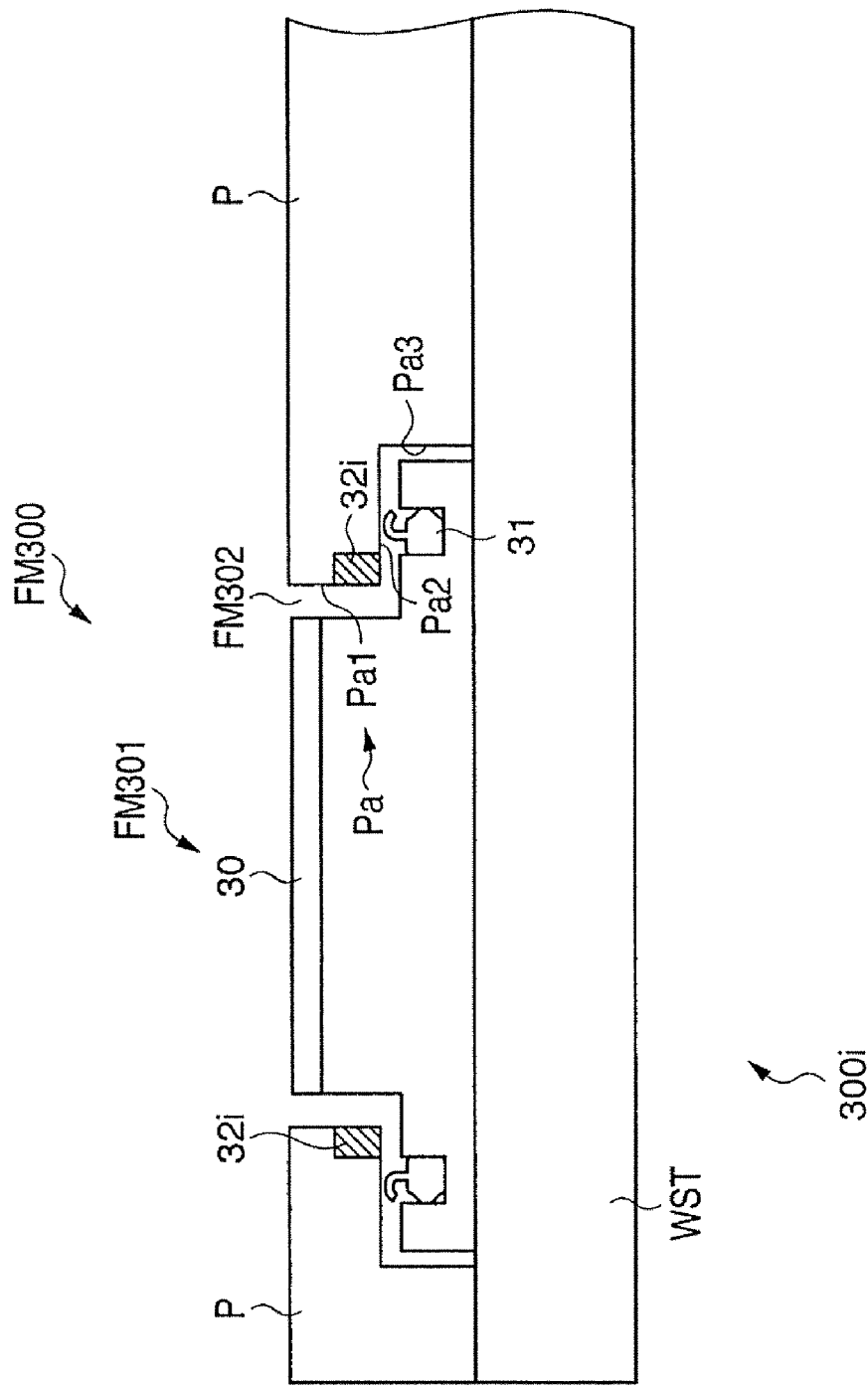

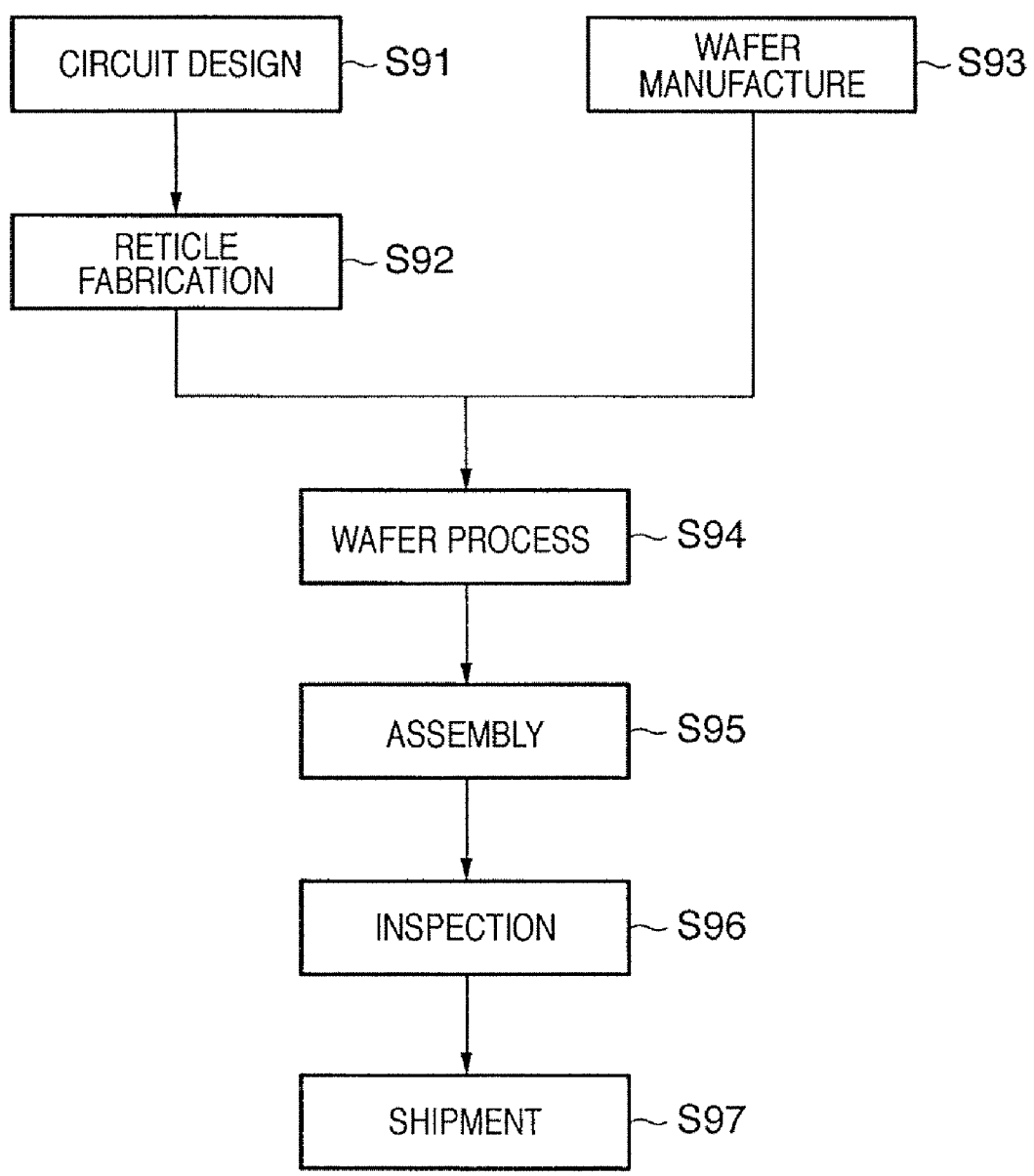

EXPOSURE APPARATUS AND DEVICE MANUFACTURING METHOD

BACKGROUND OF THE INVENTION

1. Field of the Invention

The present invention relates to an exposure apparatus and a device manufacturing method.

2. Description of the Related Art

A process of manufacturing a micropatterned semiconductor device such as an LSI or VLSI adopts a reduction projection exposure apparatus which reduces the pattern of an reticle and projects and transfers it onto a substrate coated with a photosensitive agent. Along with an improvement in packaging density of semiconductor devices, further micropatterning is becoming necessary. The exposure apparatus has coped with the micropatterning along with the development of the resist process.

To improve the resolving power of the exposure apparatus, there are a method of shortening the exposure wavelength and a method of increasing the numerical aperture (NA) of a projection optical system.

To practice the method of shortening the exposure wavelength, various light sources are under development. That is, the exposure wavelength is shifting from the 365-nm i-line to a ArF excimer laser oscillation wavelength of about 193 nm. An exposure apparatus using the Extreme Ultra Violet beam (EUV beam) with a smaller wavelength of 10-15 nm than ultraviolet wavelength are also under development.

To practice the method of increasing the numerical aperture (NA) of a projection optical system, a projection exposure technique using an immersion method is receiving a great deal of attention. The immersion method is used to perform projection exposure while the space between the final surface of a projection optical system and the surface of a substrate (e.g., a wafer) is filled with a liquid instead of a gas, unlike a conventional method. The immersion method has an advantage of improving the resolving power as compared with the conventional method even when a light source used has the same wavelength as that in the conventional method.

Assume that a liquid supplied to the space between a projection optical system and a wafer is pure water (refractive index: 1.33), and the maximum incident angle of a light beam applied on the wafer in the immersion method is equal to that in the conventional method. In this case, as the NA of the projection optical system in the immersion method is 1.33 times that in the conventional method, the resolving power in the immersion method improves to 1.33 times that in the conventional method.

In this manner, the immersion method can obtain a resolving power corresponding to NA≧1, which is impossible in the conventional method. To achieve the immersion method, various exposure apparatuses are proposed.

Japanese Patent Laid-Open No. 2005-19864 proposes an exposure apparatus which comprises a liquid supply nozzle arranged around a projection optical system in a first direction when seen from it, and a flat plate (top plate) arranged on a substrate stage to be nearly flush with the surface of a substrate to hold an immersion region. This exposure apparatus supplies a liquid onto the substrate surface via the liquid supply nozzle when the substrate stage moves the substrate in a second direction opposite to the first direction. The liquid is continuously supplied onto the substrate surface via the liquid supply nozzle so that a liquid film extends continuously as the substrate moves. This makes it possible to surely fill the space between the substrate surface and the final surface of the projection optical system with the liquid.

Japanese Patent Laid-Open No. 2005-116570 proposes an exposure apparatus which comprises a light-receiving unit for receiving light which has passed though a projection optical system via a slit plate arranged on the image plane of the projection optical system, and a temperature sensor for detecting the temperature information of a liquid which fills the space between the projection optical system and the slit plate. This exposure apparatus irradiates and exposes a substrate arranged on the image plane side of the projection optical system, with exposure light via the projection optical system and liquid. Using the detection result obtained by the light-receiving unit and the measurement result obtained by the temperature sensor, this apparatus calculates performance information including the imaging performance. This allows accurate exposure processing by satisfactorily performing exposure state optimization processing on the basis of the light-receiving result obtained by the light-receiving unit.

Japanese Patent Laid-Open No. 2005-191557 proposes an exposure apparatus which comprises a substrate table for holding a substrate and a plate member which is exchangeably arranged on the substrate table and has a liquid-repellent flat surface. This makes it possible to prevent the liquid from remaining on the substrate table.

Japanese Patent Laid-Opens No. 2005-19864 disclose a rectangular measurement member. The rectangular measurement member rotates relative to a top plate when being assembled on a substrate stage. Then, the width of the gap between the opening side surface of the top plate and the outer surface of the measurement member readily changes depending on the gap position. Assume here that a liquid supplied to the space between a projection optical system and a wafer nonuniformly enters the gap. In this case, the temperature drop of the liquid due to its vaporization heat varies, so the thermal deformation amount of the measurement member also varies. This may result in a decrease in the accuracy of measurement using a reference mark.

When a drainage unit for draining the liquid which has entered the gap between the opening side surface of the top plate and the outer surface of the measurement member is formed in the measurement member, the easiness of mounting of the drainage unit may be limited.

Japanese Patent Laid-Open No. 2005-19864, No. 2005-116570, and No. 2005-191557 does not disclose a concrete structure to prevent a liquid which has entered the gap between the opening side surface of the top plate and the outer surface of the measurement member from reaching the substrate stage.

SUMMARY OF THE INVENTION

The present invention provides an exposure apparatus which can improve the accuracy of measurement using a measurement member, and a device manufacturing method.

The present invention also provides an exposure apparatus which can improve the easiness of mounting of a drainage unit, and a device manufacturing method.

The present invention also provides an exposure apparatus which can reduce deterioration in constituent elements, and a device manufacturing method.

According to the first aspect of the present invention, there is provided an exposure apparatus which exposes a substrate via a liquid, comprising: a projection optical system configured to project a pattern of a reticle onto the substrate; a substrate stage configured to hold the substrate and move; a top plate which is arranged on the substrate stage and in which an opening is formed; and a measurement member which is arranged in the opening formed in the top plate arranged on the substrate stage, wherein a gap is formed between the top plate and the measurement member in a plane perpendicular to an optical axis of the projection optical system, and wherein the measurement member is formed of one of a regular N-sided polygon (N>4) and a circle in the plane.

According to the second aspect of the present invention, there is provided an exposure apparatus which exposes a substrate via a liquid, comprising: a projection optical system configured to project a pattern of a reticle onto the substrate; a substrate stage configured to hold the substrate and move; a top plate which is arranged on the substrate stage and in which an opening is formed; and a measurement member which is arranged in the opening formed in the top plate arranged on the substrate stage, wherein a gap is formed between the top plate and the measurement member in a plane perpendicular to an optical axis of the projection optical system, and wherein the exposure apparatus satisfies following formula: $\gamma \cdot \cos \theta 1 \cdot L1 + \gamma \cdot \cos \theta 2 \cdot L2 + Pf \cdot S < 0$ where $\theta 1$ is a contact angle between the measurement member and the liquid, L1 is an outer circumferential length of the measurement member in the plane, $\theta 2$ is a contact angle between the top plate and the liquid, L2 is an inner circumferential length of the opening in the plane, Pf is a liquid pressure of the liquid which has partially entered the gap, $\gamma$ is a surface tension of the liquid, and S is an area of the gap in the plane.

According to the third aspect of the present invention, there is provided an exposure apparatus which exposes a substrate via a liquid, comprising: a projection optical system configured to project a pattern of a reticle onto the substrate; a substrate stage configured to hold the substrate and move; a top plate which is arranged on the substrate stage and in which an opening is formed; and a measurement member which is arranged in the opening formed in the top plate arranged on the substrate stage, wherein a gap is formed between the top plate and the measurement member in a plane perpendicular to an optical axis of the projection optical system, and wherein the top plate including a drainage unit configured to drain the liquid which has entered the gap.

According to the fourth aspect of the present invention, there is provided an exposure apparatus which exposes a substrate via a liquid, comprising: a projection optical system configured to project a pattern of a reticle onto the substrate; a substrate stage configured to hold the substrate and move; a top plate which is arranged on the substrate stage and in which an opening is formed; a measurement member which is arranged in the opening formed in the top plate arranged on the substrate stage and which has a front surface facing a rear surface of the top plate; and a seal member arranged between the rear surface of the top plate and the front surface of the measurement member, wherein a modulus of section of the seal member is smaller than a modulus of section of a circle.

According to the fifth aspect of the present invention, there is provided a device manufacturing method comprising: exposing a substrate to light using an exposure apparatus according to first aspect of the present invention; and developing the exposed substrate.

The exposure apparatus according to the first aspect or second aspect of the present invention can improve the accuracy of measurement using a measurement member.

The exposure apparatus according to the third aspect of the present invention can improve the easiness of mounting of a drainage unit.

The exposure apparatus according to the fourth aspect of the present invention can reduce deterioration in constituent elements.

Further features and aspects of the present invention will become apparent from the following description of exemplary embodiments with reference to the attached drawings.

BRIEF DESCRIPTION OF THE DRAWINGS

FIG. 2 is a plan view showing the arrangement of a wafer stage, top plate, and substrate reference mark member;

FIG. 11 is an enlarged sectional view of a substrate reference mark member according to a modification to the third embodiment of the present invention; and FIG. 12 is a flowchart illustrating the overall process of manufacturing a semiconductor device.

DESCRIPTION OF THE EMBODIMENTS

The present invention relates to an exposure apparatus and exposure method which transfer the pattern of an reticle onto a substrate coated with a photosensitive agent in manufacturing a device such as a semiconductor device or liquid crystal display device and, more particularly, to an exposure apparatus and exposure method using an immersion method.

Figure 1:
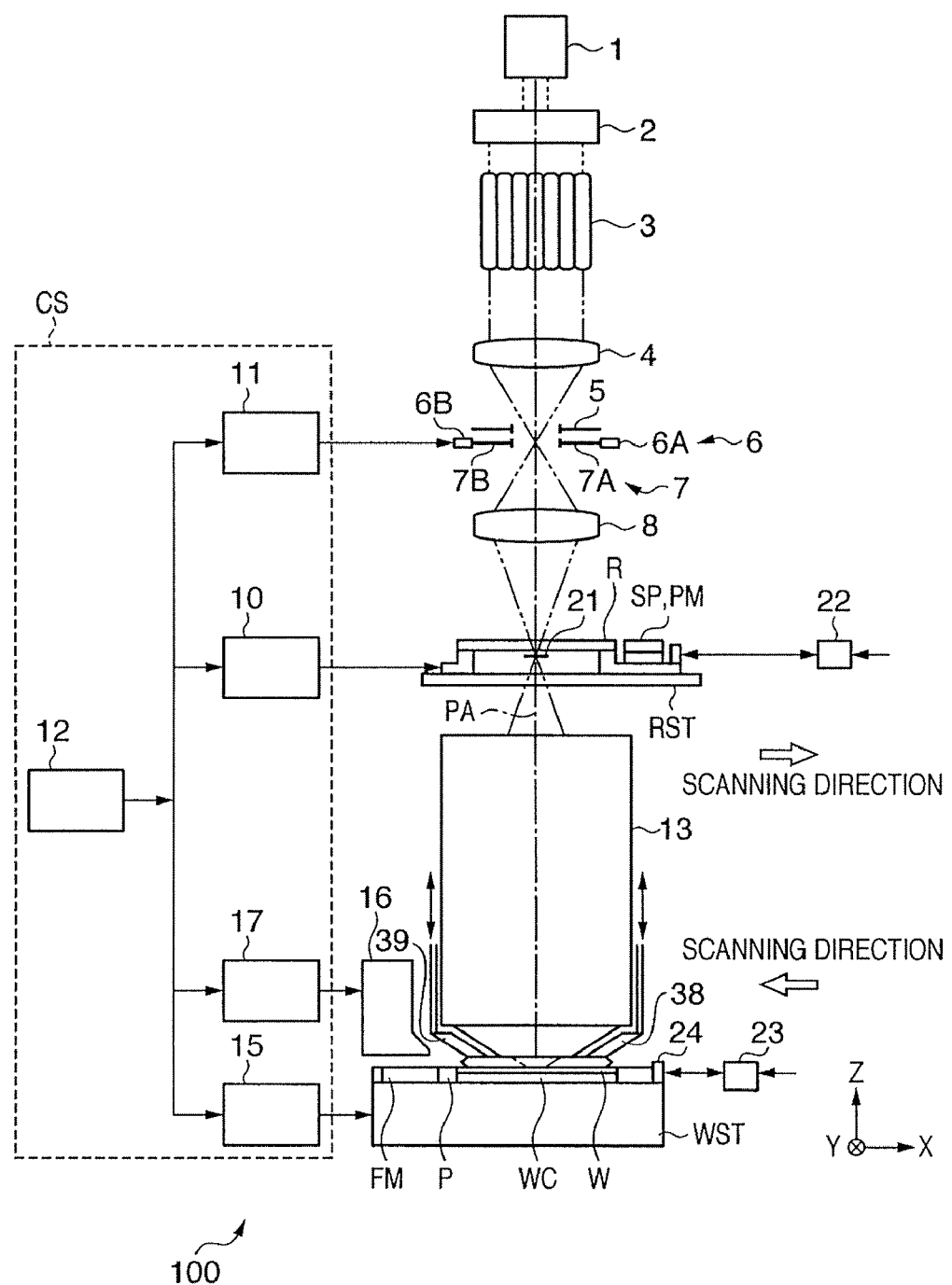
FIG. 1 is a view showing the arrangement of an exposure apparatus according to the first embodiment.

An exposure apparatus 100 according to the first embodiment of the present invention will be explained with reference to FIG. 1. FIG. 1 is a view showing the arrangement of the exposure apparatus 100 according to the first embodiment.

The exposure apparatus 100 comprises an shaping optical system 2, fly-eye lens 3, condenser lens 4, field stop 5, driving unit 6, movable blind 7, relay lens system 8, reticle stage RST, reference plate SP, and projection optical system 13. The exposure apparatus 100 also comprises a wafer stage (substrate stage) WST, top plate P, substrate reference mark member FM, liquid supply nozzle 38, liquid recovery nozzle 39, alignment detection system 16, and controlling system CS.

The shaping optical system 2 is arranged downstream of a light source 1 along an optical axis PA. Examples of the light source 1 are excimer laser light sources such as an $F_2$ excimer laser, ArF excimer laser, and KrF excimer laser, and a metal vapor laser light source. Other examples of the light source 1 are a pulse light source such as a harmonic wave generator of a YAG laser, and a continuous light source such as a combination of a mercury lamp and elliptic reflecting mirror. An illumination light beam from the light source 1 is set to have a predetermined diameter by the shaping optical system 2, and supplied to the downstream side along the optical axis PA.

When a pulse light source is used, exposure is switched on or off by controlling power supplied from its power supply. When a continuous light source is used, exposure is switched on or off by a shutter in the shaping optical system 2. Alternatively, exposure may be switched on or off by opening or closing the movable blind (variable field stop) 7 provided as will be described later.

The fly-eye lens 3 is arranged downstream of the shaping optical system 2 along the optical axis PA. The fly-eye lens 3 forms a large number of secondary light sources on the basis of the light beam which has entered from the shaping optical system 2.

The condenser lens 4 is arranged downstream of the fly-eye lens 3 along the optical axis PA. The condenser lens 4 receives the large number of secondary light beams which have entered from the large number of secondary light source formed in the vicinity of exit surface of the fly-eye lens 3, and guides them to the downstream side along the optical axis PA.

The field stop 5 is arranged downstream of the condenser lens 4 along the optical axis PA. The field stop 5 has a rectangular slit-like opening in which the degree of opening is fixed. The longitudinal direction of the slit-like opening is, e.g., a direction (Y direction) perpendicular to the sheet surface. The field stop 5 forms a light beam having a rectangular slit-like section, and limits the amount of light guided to the relay lens system 8 via the movable blind 7.

Although the field stop 5 is arranged on the side of the condenser lens 4 with respect to the movable blind 7 in this embodiment, it may be arranged on the side of the relay lens system 8 with respect to the movable blind 7.

The driving unit 6 and movable blind 7 are arranged downstream of the field stop 5 along the optical axis PA.

The movable blind 7 includes a first blade 7A, second blade 7B, third blade (not shown), and fourth blade (not shown). The first blade 7A and second blade 7B define the dimension of a circuit pattern in the scanning direction (x direction), as will be described later. The third blade and fourth blade define the dimension of the circuit pattern in the non-scanning direction (Y direction) perpendicular to the scanning direction.

The driving unit 6 includes a first driving unit 6A and second driving unit 6B. The first driving unit 6A drives the first blade 7A under the control of the controlling system CS. The second driving unit 6B drives the second blade 7B under the control of the controlling system CS. That is, the controlling system CS independently controls the driving of the first blade 7A and second blade 7B. Since the degree of opening of the movable blind 7 can be changed in this way, it is also called a variable field stop.

The relay lens system 8 is arranged downstream of the driving unit 6 and movable blind 7 along the optical axis PA. The relay lens system 8 sets the movable blind 7 to be conjugate with the pattern formation surface of a reticle R. That is, the relay lens system 8 refracts the light beam which has entered from the movable blind 7, and guides it to the reticle R.

The reticle stage RST is arranged downstream of the relay lens system 8 along the optical axis PA. The reticle stage RST holds the reticle R. The position of the reticle stage RST is detected by an interferometer 22. On the basis of the detection result obtained by the interferometer 22, the controlling system CS controls the driving of the reticle stage RST to align the reticle R. The reticle R is illuminated with the light beam which is guided from the relay lens system 8 and in which a rectangular slit-like illumination region 21 has a uniform illuminance. Since the relay lens system 8 is a bilateral telecentric optical system, the telecentricity is also maintained in the slit-like illumination region 21 on the reticle R.

The reference plate SP is arranged around the reticle stage RST. An reticle reference mark PM is formed on the reference plate SP. The reticle reference mark PM is used to calibrate the apparatus.

The projection optical system 13 is arranged downstream of the reticle stage RST along the optical axis PA. The projection optical system 13 refracts the light beam which has passed through the reticle R and reference plate SP, and guides it to the downstream side along the optical axis PA. The projection optical system 13 includes a plurality of optical elements. Of the plurality of optical elements included in the projection optical system 13, an optical element on the most downstream side (image plane side) will be called a final optical element hereinafter. The final optical element is planoconvex lens having contact flat surface with liquid.

The wafer stage WST is arranged downstream of the projection optical system 13 along the optical axis PA. The wafer stage WST holds a wafer W via a wafer chuck WC. The wafer chuck WC chucks the wafer W by vacuum suction so that the wafer stage WST holds it. The position of the wafer stage WST is detected by an interferometer 23. On the basis of the detection result obtained by the interferometer 23, the controlling system CS controls the driving of the wafer stage WST in six axial directions (X direction, Y direction, z direction, θx direction, θy direction, and θz direction) to align the wafer W. The θx, θy, and θz directions are rotation directions about the X-, Y-, and Z-axes, respectively.

The wafer stage WST includes, e.g., an X-Y stage (not shown) which undergoes driving control in the X and Y directions, and a Z stage (not shown) which undergoes driving control in the Z direction. The circuit pattern of the slit-like illumination region 21 defined on the reticle R by the movable blind 7 is imaged and transferred onto the wafer W via the projection optical system 13 with the light beam guided from the projection optical system 13.

The top plate P is arranged around the wafer stage WST. The top plate P is formed to have an upper surface nearly flush with the surface of the wafer W. The top plate P is chucked by vacuum suction by a vacuum chucking mechanism (not shown) built in the wafer stage WST, and is held by the wafer stage WST.

The substrate reference mark member FM is arranged in an opening formed in the top plate P. The substrate reference mark member FM is used to calibrate the apparatus and align the reticle R and wafer W.

The liquid supply nozzle 38 is arranged above the wafer W at a position at which it can supply a liquid to the gap (space) between the wafer W and the final optical element of the projection optical system 13. The liquid supply nozzle 38 is connected to a liquid supply pipe (not shown). The liquid supply pipe includes, e.g., a pump, temperature controller, and filter (none of them is shown). For example, a liquid undergoes impurity removal by the filter, is heated to a predetermined temperature by the temperature controller, is pressurized at a predetermined pressure by the pump, and is supplied to the liquid supply nozzle 38 via the liquid supply pipe. Note that the liquid supply nozzle 38 is opened or closed under the control of the controlling system CS, and supplies a liquid to the gap (space) between the wafer W and the projection optical system 13 at a predetermined timing and in a predetermined period.

The liquid recovery nozzle 39 is arranged above the wafer W at a position at which it can recover the liquid from the gap (space) between the wafer W and the final optical element of the projection optical system 13. The liquid recovery nozzle 39 includes, e.g., a liquid recovery pipe, pump, and gas-liquid separator (none of them is shown). For example, the liquid in the gap (space) between the wafer W and the final optical element of the projection optical system 13 is recovered to the liquid recovery pipe via the liquid recovery nozzle 39. The liquid recovered to the liquid recovery pipe is pressurized at a predetermined pressure by the pump, and is separated into a gas component and liquid component by the gas-liquid separator. The gas component is drained to the atmosphere, while the liquid component is supplied to the liquid supply pipe and reused. Note that the liquid recovery nozzle 39 is opened or closed under the control of the controlling system CS, and recovers the liquid from the gap (space) between the wafer W and the final optical element of the projection optical system 13.

The alignment detection system 16 is arranged above the wafer W at a position offset from the optical axis PA. That is, the alignment detection system 16 adopts an off-axis scheme. The alignment detection system 16 detects an alignment mark on the wafer W and sends the detection result to the controlling system CS.

The controlling system CS comprises a main control unit 12, movable blind control unit 11, reticle stage driving unit 10, measurement control unit 17, and wafer stage driving unit 15. The main control unit 12 monitors or controls the overall operation of the exposure apparatus 100.

For example, the measurement control unit 17 controls the alignment detection system 16 to perform alignment detection. Alternatively, the measurement control unit 17 controls a focus detection system (not shown) to perform focus detection.

For example, the main control unit 12 receives information on the position of the reticle stage RST from the interferometer 22. On the basis of the position of the reticle stage RST, the main control unit 12 determines the driving amount of the reticle stage RST, and sends it to the reticle stage driving unit 10. On the basis of the driving amount determined by the main control unit 12, the reticle stage driving unit 10 controls the driving of the reticle stage RST.

For example, the main control unit 12 receives information on the position of the wafer stage WST. The main control unit 12 receives information on, e.g., the X, Y, and θz positions of the wafer W from the alignment detection system 16. The main control unit 12 receives information on, e.g., the Z, θz, and θy positions of the wafer W from the focus detection system. On the basis of the position of the wafer stage WST or wafer W, the main control unit 12 determines the driving amount of the wafer stage WST, and sends it to the wafer stage driving unit 15. On the basis of the driving amount determined by the main control unit 12, the wafer stage driving unit 15 controls the driving of the wafer stage WST.

For example, the main control unit 12 synchronously scans the reticle stage RST and wafer stage WST in the ±X directions via the reticle stage driving unit 10 and wafer stage driving unit 15, as described above. That is, in transferring a pattern image on the reticle R onto each shot region on the wafer W via the projection optical system 13 by exposure using a scanning exposure scheme, the main control unit 12 scans the reticle R in the ±X directions at an average velocity VR relative to the slit-like illumination region 21 set by the field stop 5. Letting $\beta$ be the projection magnification of the projection optical system 13, the wafer W is scanned in the ±x directions at a velocity VW (=$\beta$·VR) in synchronism with the scanning of the reticle R. With this operation, a circuit pattern image of the reticle R is sequentially transferred onto each shot region on the wafer W.

For example, the main control unit 12 receives information on, e.g., the positions of the first blade 7A and second blade 7B from a sensor (not shown). On the basis of the positions of the first blade 7A and second blade 7B, the main control unit 12 determines the driving amounts of the first blade 7A and second blade 7B, and sends them to the movable blind control unit 11. On the basis of the driving amounts determined by the main control unit 12, the movable blind control unit 11 controls the driving of the driving unit 6 (first driving unit 6A and second driving unit 6B). With this operation, the first blade 7A and second blade 7B are driven to change the degree of opening of the movable blind 7.

The arrangement of the wafer stage WST, top plate P, and substrate reference mark member FM will be explained with reference to FIG. 2. FIG. 2 is a plan view showing the arrangement of the wafer stage WST, top plate P, and substrate reference mark member FM.

The wafer stage WST holds the wafer W via the wafer chuck WC (see FIG. 1). The wafer chuck WC chucks the wafer W by vacuum suction so that the wafer stage WST holds it. The wafer chuck WC is arranged near a center SC of gravity of the wafer stage WST. With this arrangement, the wafer W is held near the center SC of gravity of the wafer stage WST.

A reflecting mirror 24 for the interferometer 23 is arranged on the side surfaces of the wafer stage WST. The reflecting mirror 24 includes an X-axis reflecting mirror 24a and Y-axis reflecting mirror 24b. The interferometer 23 includes an X-axis interferometer 23a and Y-axis interferometer 23b in correspondence with the mirrors 24a and 24b. The X-axis interferometer 23a faces the X-axis reflecting mirror 24a. The X-axis interferometer 23a detects, e.g., the X-coordinate position of the wafer stage WST by receiving detection light which is projected by the X-axis interferometer 23a and reflected by the X-axis reflecting mirror 24a. The Y-axis interferometer 23b faces the Y-axis reflecting mirror 24b. The Y-axis interferometer 23b detects, e.g., the Y-coordinate position of the wafer stage WST by receiving detection light which is projected by the Y-axis interferometer 23b and reflected by the Y-axis reflecting mirror 24b.

The top plate P is arranged around the wafer stage WST. For example, on the wafer stage WST, the top plate P is arranged to fully cover a region other than a region to hold the wafer W. The top plate P is formed to have an upper surface nearly flush with the surface of the wafer W. Even when the peripheral region of the wafer W is filled with a liquid, it is possible to support the liquid in the vicinity of the peripheral region of the wafer W with the top plate P.

The substrate reference mark member FM is arranged in the opening formed in the top plate P. The substrate reference mark member FM is formed of a roughly circular shape when seen from above.

Figure 3:
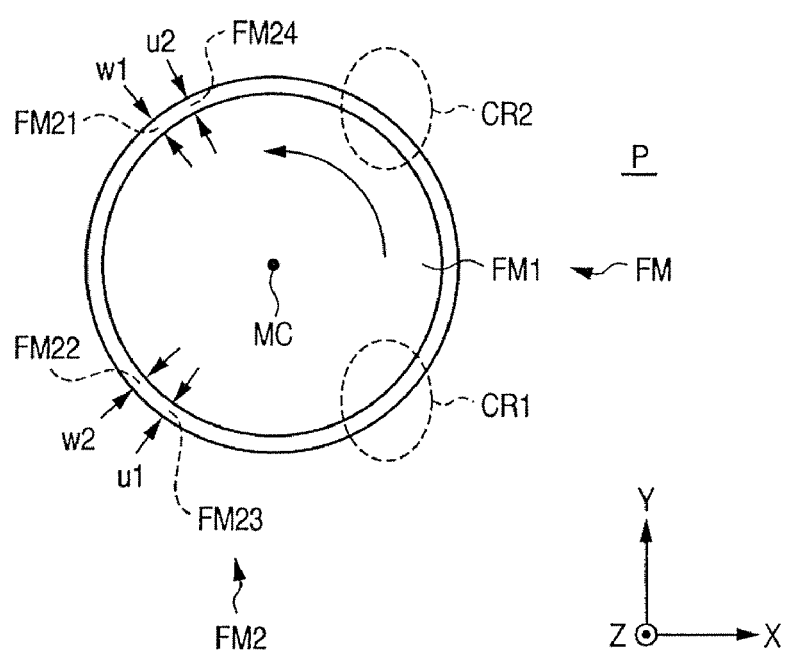
FIG. 3 is an enlarged plan view of a substrate reference mark member FM according to the first embodiment of the present invention.
Figure 4:
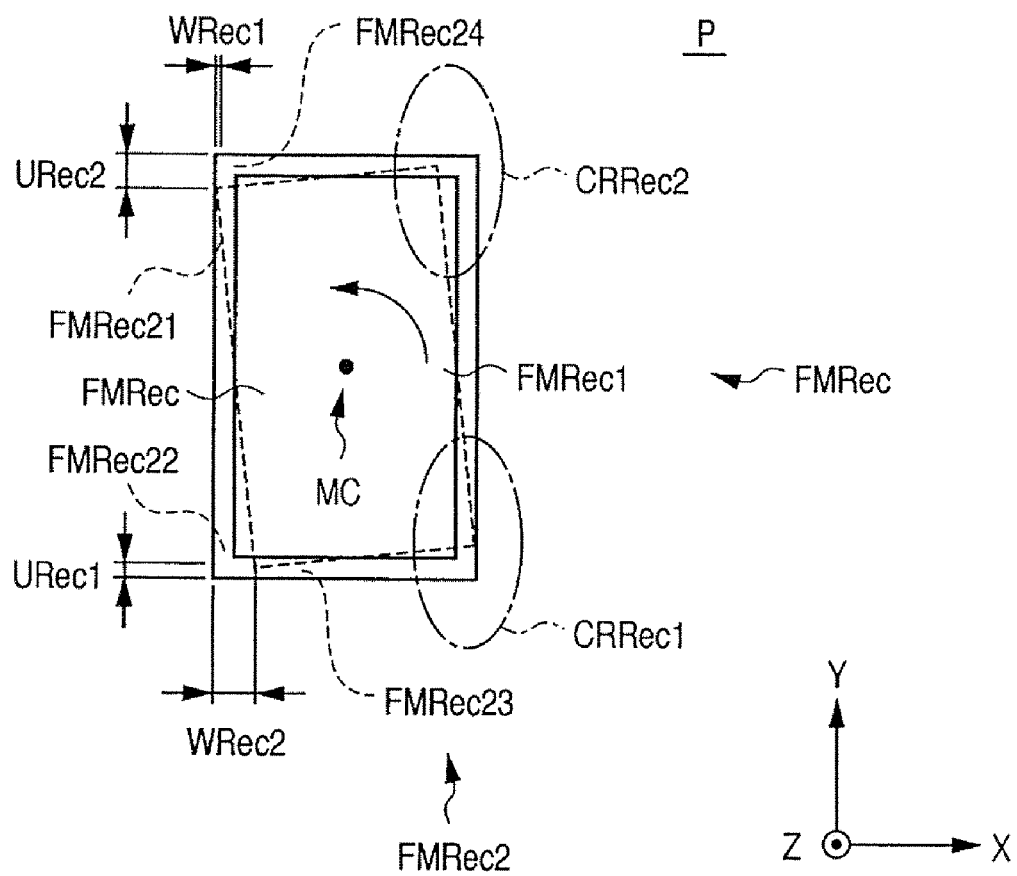
FIG. 4 is an enlarged plan view of a substrate reference mark member according to a comparative example.

A comparison between a substrate reference mark member FMRec according to a comparative example and the substrate reference mark member FM according to the first embodiment will be explained with reference to FIGS. 3 and 4. FIG. 3 is an enlarged plan view of the substrate reference mark member FM according to the first embodiment of the present invention. FIG. 4 is an enlarged plan view of the substrate reference mark member FMRec according to the comparative example.

Consider, as the comparative example, a case in which a vertically elongated rectangular substrate reference mark member FMRec is formed on the top plate P (see FIG. 2), as shown in FIG. 4.

The substrate reference mark member FMRec according to the comparative example includes a reference mark main body FMRec1 and gap FMRec2. The reference mark main body FMRec1 is formed to have an upper surface which is flush with (which has the same surface level as) that of the top plate P. The gap FMRec2 is recessed with respect to the top plate P and reference mark main body FMRec1, and serves as the gap between the opening side inner surface of the top plate P and the outer surface of the reference mark main body FMRec1. With this arrangement, the alignment detection system 16 can detect the shape of the substrate reference mark member FMRec by projecting measurement light onto it from the Z direction and receiving the light reflected and scattered by it.

The substrate reference mark member FMRec is, after rotation angle of its mark has been finely tuned, often rotated about a center MC of gravity in a rotation direction indicated by an arrow relative to the wafer stage WST. In this case, the substrate reference mark member FMRec is rotated relative to the top plate P (accordingly, relative to the X-Y coordinate system of the interferometer 23 (see FIG. 2) and the reference plate SP or reticle R).

Assume, for example, that the substrate reference mark member FMRec is rotated from a position indicated by a solid line to a position indicated by a broken line in FIG. 4. In this case, a width WRec1 of a first portion FMRec21 differs from a width WRec2 of a second portion FMRec22 in the gap FMRec2. Because WRec1<WRec2, when the gap between the surface of the wafer W and the final optical element of the projection optical system 13 is filled with a liquid, the liquid is less likely to enter the first portion FMRec21 but is more likely to enter the second portion FMRec22. A width URec1 of a third portion FMRec23 differs from a width URec2 of a fourth portion FMRec24 in the gap FMRec2. Because URec1<URec2, when the gap between the surface of the wafer W and the final optical element of the projection optical system 13 is filled with a liquid, the liquid is less likely to enter the third portion FMRec23 but is more likely to enter the fourth portion FMRec24. When seen from above, an area CARec1 of the gap FMRec2 in a first region CRRec1 differs from an area CARec2 of the gap FMRec2 in a second region CRRec2. Because CARec1<CARec2, when the gap between the surface of the wafer W and the final optical element of the projection optical system 13 is filled with a liquid, the liquid is less likely to enter the first region CRRec1 but is more likely to enter the second region CRRec2.

In this manner, the amount of liquid which enters the gap FMRec2 varies depending on the position in it. When the alignment detection system 16 projects measurement light onto the substrate reference mark member FMRec, its measurement value varies because the amount of liquid which enters the gap FMRec2 varies. This may result in a decrease in the accuracy of measurement using the substrate reference mark member FMRec.

Since the amount of liquid which enters the gap FMRec2 varies, the temperature drop of the liquid due to its vaporization heat also varies, and therefore the thermal deformation amount of the substrate reference mark member FMRec also varies. The measurement value obtained by the alignment detection system 16 varies because the thermal deformation amount of the substrate reference mark member FMRec varies. This may result in a decrease in the accuracy of measurement using the substrate reference mark member FMRec.

In contrast, the substrate reference mark member FM according to the first embodiment of the present invention is formed of a roughly circular shape, as shown in FIG. 3.

The substrate reference mark member FM according to the first embodiment of the present invention includes a reference mark main body (measurement member) FM1 and gap FM2 in a plane perpendicular to the optical axis of the projection optical system 13. The reference mark main body FM1 is formed to have an upper surface which is flush with (which has the same surface level as) that of the top plate P. The outer surface of the reference mark main body FM1 faces the inner surface of the top plate P at an almost constant distance. The gap FM2 is recessed with respect to the top plate P and reference mark main body FM1, and serves as the gap between the top plate P and the reference mark main body FM1. With this arrangement, the alignment detection system 16 can detect the shape of the substrate reference mark member FM by projecting measurement light onto it from the Z direction and receiving the light reflected and scattered by it.

The substrate reference mark member FM is often rotated about a center MC of gravity in a rotation direction indicated by an arrow relative to the wafer stage WST. In this case, the substrate reference mark member FM is rotated relative to the top plate P (accordingly, relative to the X-Y coordinate system of the interferometer 23 (see FIG. 2) and the reference plate SP or reticle R).

Assume, for example, that the substrate reference mark member FM is, after rotation angle of its mark has been finely tuned, rotated from the state shown in FIG. 3 through an angle nearly equal to the angle of rotation from a position indicated by a solid line to a position indicated by a broken line in FIG. 4. In this case, a width W1 of a first portion FM21 is nearly equal to a width W2 of a second portion FM22 in the gap FM2. Because W1≈W2, when the gap between the surface of the wafer W and the final optical element of the projection optical system 13 is filled with a liquid, the liquid uniformly enters the first portion FM21 and second portion FM22. A width U1 of a third portion FM23 is nearly equal to a width U2 of a fourth portion FM24 in the gap FM2. Because U1≈U2, when the gap between the surface of the wafer W and the final optical element of the projection optical system 13 is filled with a liquid, the liquid uniformly enters the third portion FM23 and fourth portion FM24. When seen from above, an area CA1 of the gap FM2 in a first region CR1 is nearly equal to an area CA2 of the gap FM2 in a second region CR2. Because CA1≈CA2, when the gap between the surface of the wafer W and the final optical element of the projection optical system 13 is filled with a liquid, the liquid uniformly enters the first region CR1 and second region CR2.

In this manner, the amount of liquid which enters the gap FM2 hardly varies depending on the position in it. That is, when the alignment detection system 16 projects measurement light onto the substrate reference mark member FM, its measurement value hardly varies because the amount of liquid which enters the gap FM2 hardly varies. This makes it possible to improve the accuracy of measurement (e.g., alignment measurement and calibration measurement) using the substrate reference mark member FM.

Since the amount of liquid which enters the gap FM2 hardly varies, the temperature drop of the liquid due to its vaporization heat also hardly varies, and therefore the thermal deformation amount of the substrate reference mark member FM also hardly varies. The measurement value obtained by the alignment detection system 16 hardly varies because the thermal deformation amount of the substrate reference mark member FM hardly varies. This makes it possible to improve the accuracy of measurement using the substrate reference mark member FM.

The arrows shown in FIGS. 3 and 4 do not limit the rotation directions. The same applies to a case in which the reference mark main body FM1 of the substrate reference mark member FM is rotated in an opposite rotation direction relative to the wafer stage WST.

Figure 5:
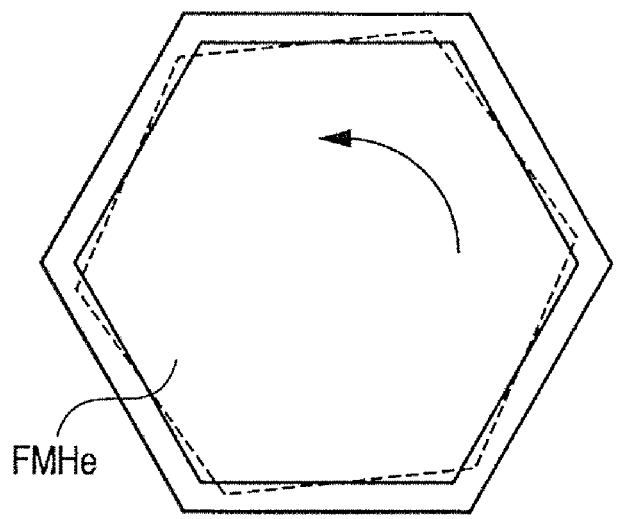
FIG. 5 is an enlarged plan view of a substrate reference mark member according to a modification to the first embodiment of the present invention.

The substrate reference mark member may be formed of a shape other than a roughly circular shape. For example, a substrate reference mark member FMHe may be formed of a roughly regular hexagonal shape, as shown in FIG. 5. Alternatively, the substrate reference mark member may be formed of a regular N-sided polygon (N>4). Even in this case, the width of the gap of the substrate reference mark member FM hardly varies. With this arrangement, the alignment detection system 16 can improve the accuracy of measurement using the substrate reference mark member as compared with a case in which the substrate reference mark member FMRec is formed of a rectangle.

A plurality of substrate reference members may be formed on the wafer stage WST.

Figure 6:
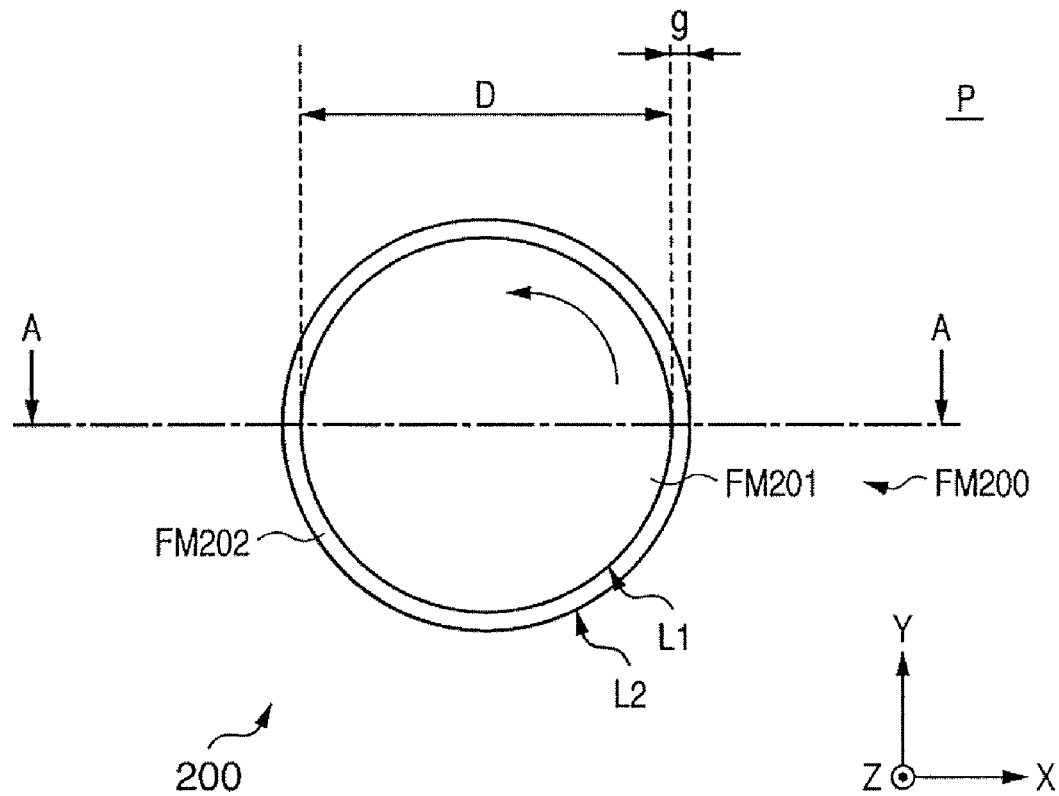
FIG. 6 is an enlarged plan view of a substrate reference mark member according to the second embodiment of the present invention.
Figure 7:
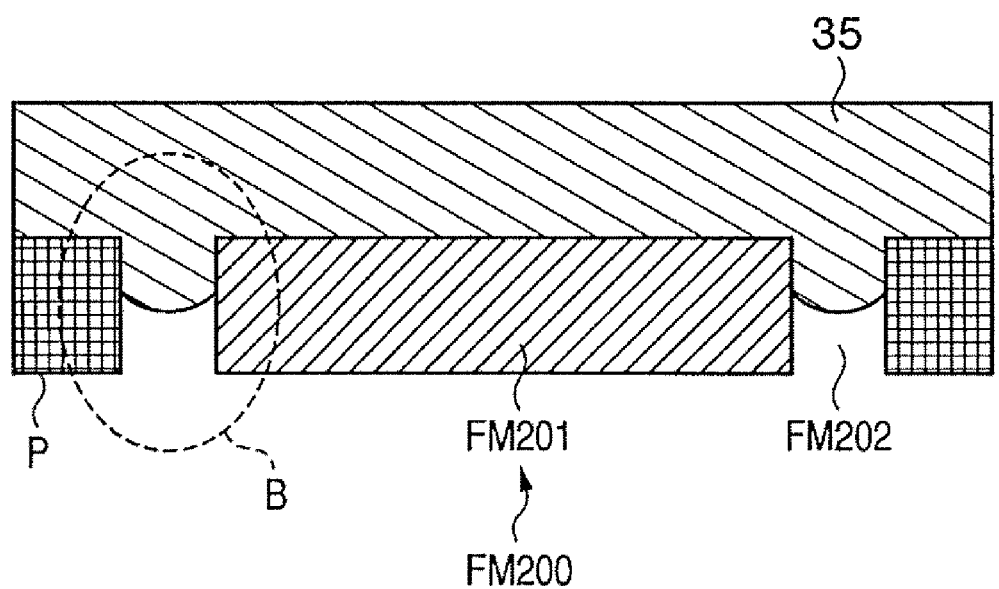
FIG. 7 is an enlarged sectional view taken along a line A-A in FIG. 6.
Figure 8:
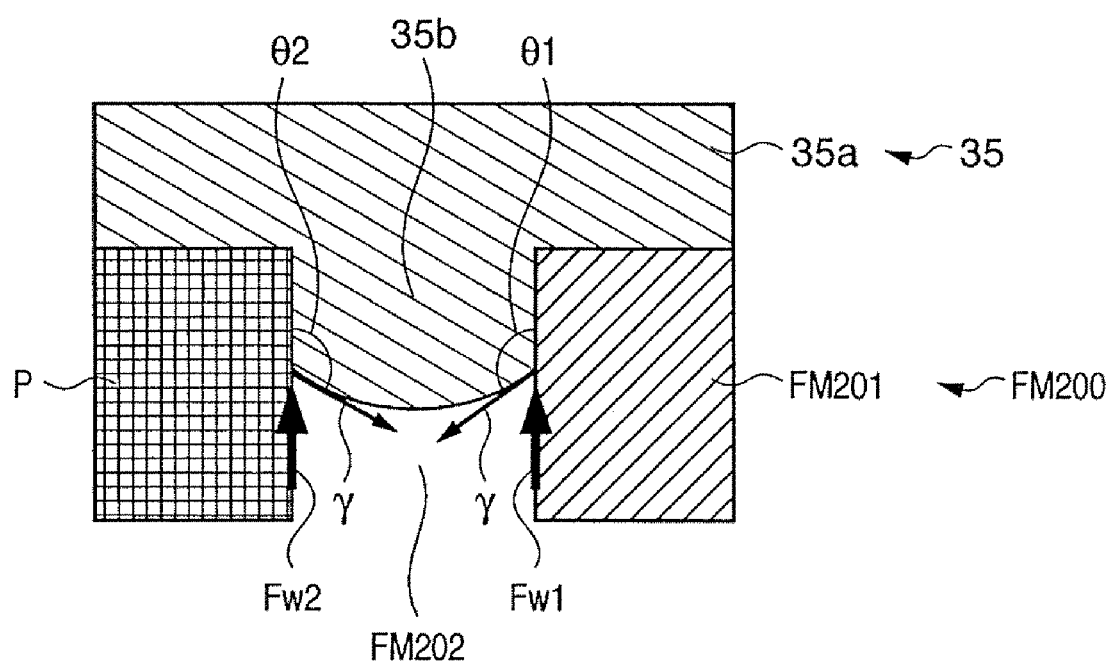
FIG. 8 is an enlarged sectional view of a portion B in FIG. 7.

An exposure apparatus 200 according to the second embodiment of the present invention will be explained next with reference to FIGS. 6 to 8. FIG. 6 is an enlarged plan view of a substrate reference mark member FM200 according to the second embodiment of the present invention. FIG. 7 is an enlarged sectional view taken along a line A-A. FIG. 8 is an enlarged sectional view of a portion B in FIG. 7. Parts different from those in the first embodiment will be mainly described below, and a description of the same parts will not be made.

The exposure apparatus 200 has the same basic arrangement as that in the first embodiment, but is different from the first embodiment in the arrangement of the substrate reference mark member FM200.

The substrate reference mark member FM200 is formed of a roughly circular shape as in the first embodiment, but is different from the first embodiment in its detailed arrangement.

That is, as shown in FIG. 6, the substrate reference mark member FM200 satisfies:

$$S = \pi \cdot g \cdot (D+g) \quad (1)$$

$$L1 = \pi \cdot D \quad (2)$$

$$L2 = \pi \cdot (D+2 \cdot g) \quad (3)$$

where D is the diameter of a reference mark main body FM201, L1 is the outer circumferential length of the reference mark main body FM201, g is the (average) width of a gap FM202, L2 is the outer circumferential length (the inner circumferential length of an opening of a top plate P) of the gap FM202, and S is the area of the gap FM202 when seen from above.

As shown in FIGS. 7 and 8, the gap FM202 of the substrate reference mark member FM200 is formed to have a width g at which a liquid 35 between the surface of a wafer W and a final optical element of a projection optical system 13 does not fully enter the gap FM202. That is, the liquid 35 is divided into a first liquid portion 35a on the substrate reference mark member FM200 and a second liquid portion 35b which has partially entered the gap FM202. Let θ1 be the contact angle at which the reference mark main body FM201 of the substrate reference mark member FM200 is in contact with the second liquid portion 35b. Let θ2 be the contact angle at which the top plate P is in contact with the second liquid portion 35b. Let γ be the surface tension of the second liquid portion 35b. Let Fw1 and Fw2 be permeation forces generated by the surface tension γ of the second liquid portion 35b. Let Pf be the liquid pressure around the surface of the second liquid portion 35b. Then, to prevent the second liquid portion 35b from entering the gap FM202 (except a partial region), the gap FM202 is formed to have an area S which satisfies:

$$Fw1 + Fw2 + Pf \cdot S < 0 \quad (4)$$

$$Fw1 + Fw2 + Pf/S < 0 \quad (5)$$

$$Fw1 = \gamma \cdot \cos \theta 1 \cdot L1 \quad (6)$$

$$Fw2 = \gamma \cdot \cos \theta 2 \cdot L2 \quad (7)$$

That is, in accordance with equations (1) to (7), the gap FM202 is formed to have a width g which satisfies:

$$\gamma \cdot \cos \theta 1 \cdot \pi \cdot D + \gamma \cdot \cos \theta 2 \cdot \pi \cdot (D+2 \cdot g) + Pf \cdot \pi \cdot g \cdot (D+g) < 0 \quad (8)$$

Assume, for example, that the diameter of the reference mark main body FM201 is D=50 mm, the contact angle between the reference mark main body FM201 and the second liquid portion 35b is θ1=110°, and the contact angle between the top plate P and the second liquid portion 35b is θ2=110°. The liquid pressure around the surface of the second liquid portion 35b is Pf=50 Pa, and the surface tension of the second liquid portion 35b is γ=0.0728 N/m. The surfaces of the reference mark main body FM201 and top plate P, which face the liquid 35, have undergone a liquid-repellent treatment. The liquid 35 is 100% pure water. Substituting these numerical values for equation (8) reveals that the gap FM202 is formed to have a width g less than 0.996 mm.

In this manner, the gap FM202 of the substrate reference mark member FM200 is formed to have a width g at which the liquid 35 does not enter the gap FM202 (except a partial region). This makes it possible to prevent the liquid 35 from entering a relatively lower portion of the gap FM202. It is therefore possible to prevent any defect (e.g., rust) generated as the liquid enters the gap.

The substrate reference mark member may be formed of a regular N-sided polygon (N>4) in place of a roughly circular shape. Alternatively, for example, a reference mark main body FM201i of a substrate reference mark member FM200i in an exposure apparatus 200i according to a modification may be formed of a roughly square shape with circular corners when seen from above, as shown in FIG. 9.

Figure 9:
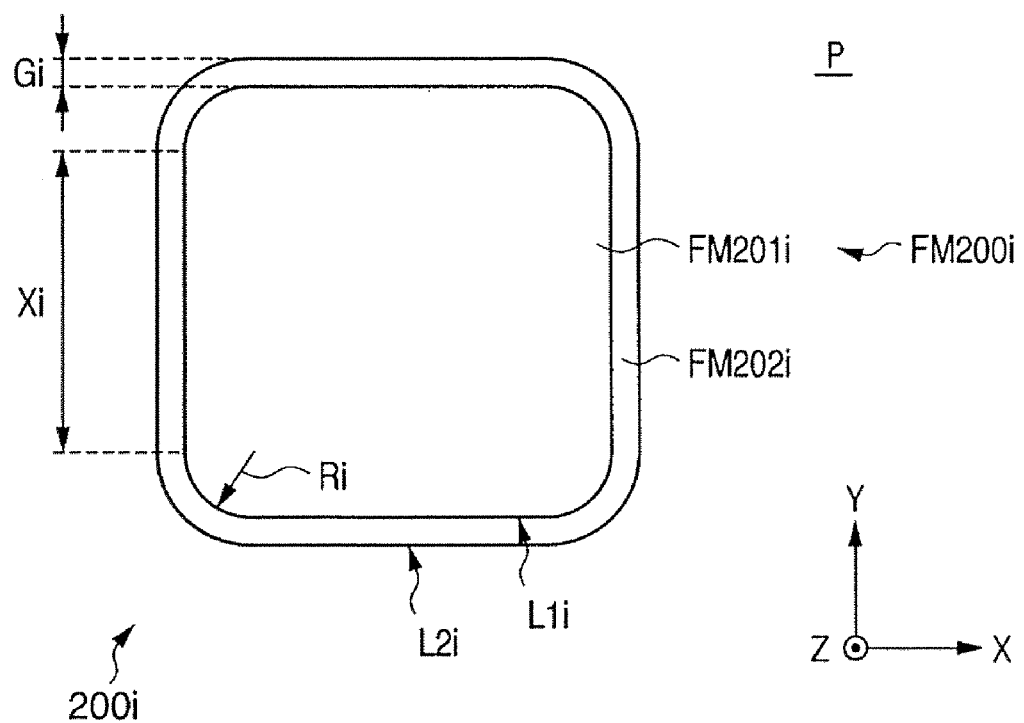
FIG. 9 is an enlarged plan view of a substrate reference mark member according to a modification to the second embodiment of the present invention.

That is, as shown in FIG. 9, the substrate reference mark member FM200i satisfies:

$$S = \pi \cdot ((R+g) \cdot 2 - R \cdot 2) + 2 \cdot X \cdot g + 2 \cdot \gamma \cdot g \quad (9)$$

$$L1 = 2\pi \cdot R + 4 \cdot X \quad (10)$$

$$L2 = 2\pi \cdot (R+g) + 4 \cdot X \quad (11)$$

where Xi is the length of a linear portion of the reference mark main body FM201i, R is the radius of curvature of a curved portion of the reference mark main body FM201i, L1i is the outer circumferential length of the reference mark main body FM201i, gi is the (average) width of a gap FM202i, L2i is the outer circumferential length of the gap FM202i, and Si is the area of the gap FM202i when seen from above.

The gap FM202i is formed to satisfy equations (4) to (7), as in the second embodiment. That is, in accordance with equations (4) to (11), the gap FM202 is formed to have a width g which satisfies:

$$Pf \cdot \pi \cdot g \cdot 2 + ((2 \cdot Pf \cdot (2 \cdot X + \pi \cdot R) + 2 \cdot \pi \cdot \gamma \cdot \cos \theta 2) \cdot g + (\gamma \cdot \cos \theta 1 + \gamma \cdot \cos \theta 2) \cdot (4 \cdot X + 2 \cdot \pi \cdot R) < 0 \quad (12)$$

If the mark main body of the substrate reference mark member is formed of a regular N-sided polygon (N>4) with circular corners when seen from above, the gap is formed to have a width g which satisfies:

$$Pf \cdot \pi \cdot (1-n/2) \cdot g \cdot 2 + (2 \cdot \pi \cdot (1-n/2) \cdot (\gamma \cdot \cos \theta 2 + Pf \cdot R) + Pf \cdot n \cdot X) \cdot g + \gamma \cdot (n \cdot X + 2 \cdot \pi \cdot R(1-n/2)) \cdot (\cos \theta 1 + \cos \theta 2) < 0 \quad (13)$$

Figure 10:
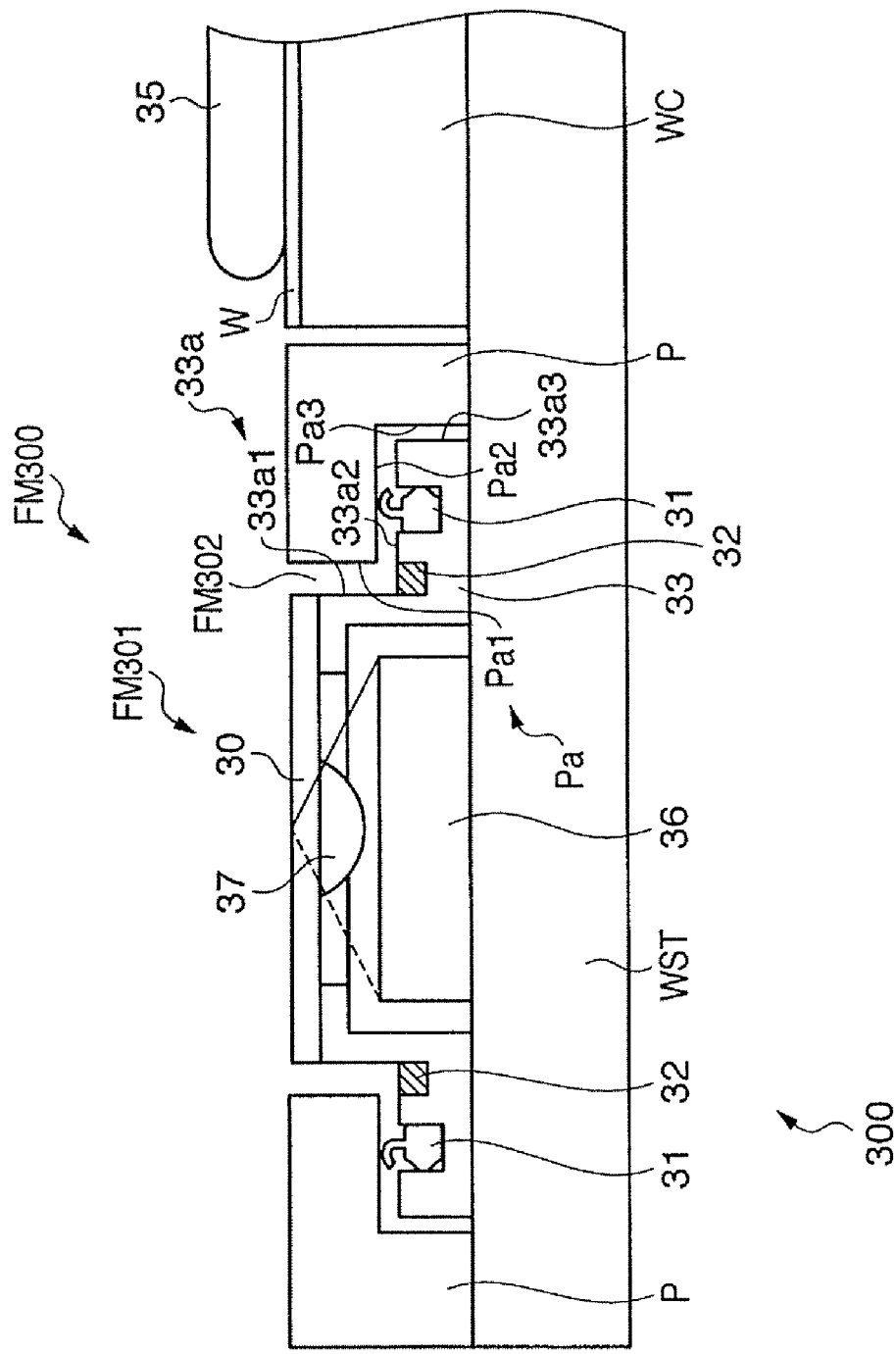
FIG. 10 is an enlarged sectional view of a substrate reference mark member according to the third embodiment of the present invention.

An exposure apparatus 300 according to the third embodiment of the present invention will be explained next with reference to FIG. 10. FIG. 10 is an enlarged sectional view of a substrate reference mark member FM300 according to the third embodiment of the present invention.

The exposure apparatus 300 has the same basic arrangement as that in the first embodiment, but is different from the first embodiment in the arrangement of the substrate reference mark member FM300.

The substrate reference mark member FM300 is formed of a roughly circular shape as in the first embodiment, but is different from the first embodiment in its detailed arrangement.

That is, the substrate reference mark member FM300 comprises a bolt (not shown), reference mark main body FM301, photoelectric conversion device 36, optical element 37, gap FM302, drainage unit 32, and seal member 31.

The bolt fixes the reference mark main body FM301 on a wafer stage WST.

The reference mark main body FM301 includes a glass portion 30 and supporting portion 33. The glass portion 30 is formed from light-transmittable glass and located at the upper portion of the reference mark main body FM301. A mark for apparatus calibration or alignment is drawn on the glass portion 30. The supporting portion 33 supports the glass portion 30 on the wafer stage WST.

The photoelectric conversion device 36 is formed to be covered with the reference mark main body FM301. With this arrangement, the photoelectric conversion device 36 can receive detection light scattered by the mark at the upper portion (glass) of the reference mark main body FM301.

The optical element 37 is formed of a hemisphere and arranged between the glass portion 30 and the photoelectric conversion device 36 while being held by optical contact. When detection light with $NA \geq 1$ is applied to the glass portion 30 via a liquid 35, the optical element 37 can guide the light to the photoelectric conversion device 36 without total reflection. In this embodiment, the detection light may be the exposure light.

The gap FM302 is recessed with respect to a top plate P and the reference mark main body FM301, and serves as the gap between an opening side inner surface Pa of the top plate P and an outer surface 33a of the reference mark main body FM301. The inner surface Pa includes a vertical surface Pa1, horizontal surface Pa2, and vertical surface Pa3. The outer surface 33a includes a vertical surface 33a1, horizontal surface (front surface) 33a2, and vertical surface 33a3.

The drainage unit 32 is formed to surround the reference mark main body FM301 below the gap FM302. The drainage unit 32 is connected to a drainage pipe (not shown). The drainage pipe has a drainage pump (not shown) to generate a negative pressure in the drainage pipe, thereby facilitating drainage. The drainage unit 32 is formed from a porous material, and its porosity is adjusted so as to reduce a variation in drainage velocity (or drainage flow rate) throughout the entire circumference. The drainage pump can modulate the drainage velocity (or drainage flow rate) in the drainage pipe under the control of the controlling system CS. This makes it possible to reduce a variation in the drainage velocity (or drainage flow rate) of liquid 35 flowing into the drainage unit 32 via the gap FM302.

The seal member 31 is arranged in the gap formed between the horizontal surface (rear surface) Pa2 in the opening side inner surface Pa of the top plate P and the horizontal surface 33a2 in the outer surface 33a of the reference mark main body FM301. The seal member 31 supports the top plate P from below. The modulus of section of the seal member 31 is smaller than the modulus of section of a circle. An example of the seal member 31 is a lip seal formed from, e.g., high-purity fluorocarbon rubber.

The seal member 31 is arranged on the outer circumferential side (outside the center MC of gravity of the reference mark main body FM301 in the radial direction) of the drainage unit 32. The seal member 31 seals the gap formed between the horizontal surface Pa2 in the opening side inner surface Pa of the top plate P and the horizontal surface 33a2 in the outer surface 33a of the reference mark main body FM301.

Consider a case in which the liquid 35 has entered the gap FM302 of the substrate reference mark member FM300. Most of the liquid 35 which has entered the gap FM302 is drained by the drainage unit 32. The drainage unit 32 is adjusted so as to reduce a variation in the drainage velocity (or drainage flow rate) throughout the entire circumference by utilizing, e.g., its material characteristics and the drainage pump on its downstream side. With this arrangement, the amount of liquid flowing through the gap FM302 hardly varies. This makes it possible to improve the accuracy of measurement using the substrate reference mark member FM300.

Since the amount of liquid flowing through the gap FM302 hardly varies, the temperature drop of the liquid due to its vaporization heat also hardly varies, and therefore the thermal deformation amount of the substrate reference mark member FM300 also hardly varies. This makes it possible to improve the accuracy of measurement using the substrate reference mark member FM300.

Since the drainage unit 32 is formed near the lower surface of the top plate P, it is possible to suppress the drainage unit 32 from being irradiated with exposure light. Even when the drainage unit 32 is made of a porous material, it hardly suffers contamination.

The liquid 35 which has reached the outer circumference of the drainage unit 32 without being drained from the drainage unit 32 is prevented from moving to the wafer stage WST by the seal member 31. That is, the gap FM302 and wafer stage WST form a spatially, nearly sealed structure between themselves. This makes it possible to suppress the liquid 35 from scattering to the wafer stage WST. It is therefore possible to suppress, e.g., the wafer stage WST from suffering any defect such as rust, thus reducing deterioration in the constituent elements of the exposure apparatus 300.

Since the modulus of section of the seal member (e.g., a lip seal) 31 is smaller than that of a circle, its rigidity can be decreased as compared with a case in which the seal member is, e.g., an O-ring. This makes it possible to reduce a reaction force which the seal member applies to the top plate P upon sealing the gap. The top plate P can thus be suppressed from floating upon canceling the vacuum chucking force acting on it. It is therefore possible to suppress, e.g., the top plate P from clashing with a projection optical system 13, liquid supply nozzle 38, and liquid recovery nozzle 39 and damaging them, thus reducing deterioration in the constituent elements of the exposure apparatus 300.

Assume, for example, that the inner diameter of the seal member is about 70 mm. If the seal member is an O-ring, its reaction force is about 20 kgf. In contrast, if the seal member is a lip seal, its reaction force can be suppressed to about 2 kgf.

Since a reaction force which the seal member applies to the top plate P upon sealing the gap can be reduced, it is possible to decrease the rigidity required for the supporting portion 33 of the reference mark main body FM301 and that required for the top plate P supported by the seal member 31. This makes it possible to decrease the thickness of the supporting portion 33 of the reference mark main body FM301 and that of the top plate P, thus reducing the weights of the reference mark main body FM301 and top plate P.

As the top plate P is arranged on the wafer stage WST, it preferably has a light weight and high rigidity. The top plate P is preferably formed from, e.g., ceramics. A reaction force which the seal member 31 applies to the top plate P is preferably equal to or smaller than the gravity acting on the top plate P. Assume that a reaction force which the seal member 31 applies to the top plate P is equal to or larger than the gravity acting on the top plate P. In this case, upon turning off a vacuum chucking mechanism (not shown) chucking the top plate P by vacuum suction, the top plate P floats due to a reaction force which the seal member 31 applies to the top plate P. Consequently, the upper surface of the top plate P becomes higher than the surface of a wafer W. In this state, when the wafer stage WST moves, the top plate P may clash with, e.g., the projection optical system 13, liquid supply nozzle 38, and liquid recovery nozzle 39.

As shown in FIG. 11, a drainage unit 32$i$ for draining the liquid 35 which has entered the gap FM302 in an exposure apparatus 300$i$ may be formed by opening the top plate P. Arranging the drainage unit 32$i$ on the top plate P makes it possible to freely extend a drainage pipe (not shown) connected to the drainage unit 32$i$ inside the top plate P. This makes it possible to improve the degree of freedom of design (the easiness of mounting) of each of the drainage unit 32$i$ and drainage pipe. When a plurality of substrate reference mark members FM300 are formed on the wafer stage WST, it is possible to branch and integrate drainage pipes for the plurality of substrate reference mark members FM300 inside the top plate P, thus improving the easiness of mounting as well. Although FIG. 11 shows an example in which the drainage unit 32$i$ is arranged on the vertical surface Pa1 in the opening side inner surface Pa of the top plate P, it may be arranged on the horizontal surface Pa2 in the opening side inner surface Pa of the top plate P. This makes it possible to suppress the drainage unit 32 from being irradiated with exposure light and hence to irradiate a porous portion with the exposure light. It is therefore possible to reduce deterioration in the constituent elements so as to prevent contamination generation.

A reference mark formed on the upper surface of a reference mark main body of a substrate reference mark member according to each of the first to third embodiments may have a slit shape as disclosed in, e.g., Japanese Patent Laid-Open No. 2005-175034 (U.S. Pat. No. 7,221,431).

For example, a measurement unit which performs measurement using a reference mark main body of a substrate reference mark member may include, e.g., an illuminance sensor disclosed in Japanese Patent Laid-Open No. 11-16816 (US Application No. 2002/061469). The measurement unit may include, e.g., a wavefront aberration measurement unit disclosed in Japanese Patent Laid-Open No. 8-22951 (U.S. Pat. No. 5,760,879). Note that if the measurement unit includes, e.g., the wavefront aberration measurement unit disclosed in Japanese Patent Laid-Open No. 8-22951, it is necessary to form a glass portion on which a slit pattern is drawn at the upper portion of the reference mark main body so as to prevent a liquid from entering, e.g., the wavefront aberration measurement unit.

Although each of the first to third embodiments has exemplified a scanning exposure apparatus, the present invention is not particularly limited to this and may be applied to a step & repeat exposure apparatus. The exposure apparatus may have one or a plurality of wafer stages.

A process (method) of manufacturing a device using an exemplary exposure apparatus to which a wafer stage apparatus according to the present invention is applied will be explained next with reference to FIG. 12. FIG. 12 is a flowchart illustrating the overall process of manufacturing a semiconductor device as an example of the device.

In step S91 (circuit design), the circuit of a semiconductor device is designed.

In step S92 (reticle fabrication), a reticle (also called a mask) is fabricated on the basis of the designed circuit pattern.

In step S93 (wafer manufacture), a wafer (also called a substrate) is manufactured using a material such as silicon.

In step S94 (wafer process) called a preprocess, the above-described exposure apparatus forms an actual circuit on the wafer by lithography using the reticle and wafer.

In step S95 (assembly) called a post-process, a semiconductor chip is formed using the wafer manufactured in step S94. This step includes processes such as assembly (dicing and bonding) and packaging (chip encapsulation).

In step S96 (inspection), inspections including operation check test and durability test of the semiconductor device manufactured in step S95 are performed. A semiconductor device is completed with these processes and shipped in step S97.

The wafer process in step S94 includes: an oxidation step of oxidizing the wafer surface; a CVD step of forming an insulating film on the wafer surface; an electrode formation step of forming an electrode on the wafer by vapor deposition; an ion implantation step of implanting ions in the wafer; a resist processing step of applying a photosensitive agent on the wafer; an exposure step of exposing, using the above-described exposure apparatus, the wafer having undergone the resist processing step to light via the reticle pattern to form a latent image pattern on the resist; a development step of developing the wafer exposed in the exposure step; an etching step of etching portions other than the latent image pattern developed in the development step; and a resist removal step of removing any unnecessary resist remaining after etching. These steps are repeated to form multiple circuit patterns on the wafer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-097629, filed Apr. 3, 2007, which is hereby incorporated by reference herein in its entirety.

What is claimed is:

1. An exposure apparatus which exposes a substrate via a liquid, comprising:
  a projection optical system configured to project a pattern of a reticle onto the substrate;
  a substrate stage configured to hold the substrate and move;
  a top plate which is arranged on the substrate stage and in which an opening is formed; and
  a measurement member which is arranged in the opening formed in the top plate arranged on the substrate stage,
  wherein a gap is formed between the top plate and the measurement member in a plane perpendicular to an optical axis of the projection optical system, and
  wherein the exposure apparatus satisfies following formula:

$$\gamma \cdot \cos \theta 1 \cdot L1 + \gamma \cdot \cos \theta 2 \cdot L2 + Pf \cdot S < 0$$

where $\theta 1$ is a contact angle between the measurement member and the liquid, L1 is an outer circumferential length of the measurement member in the plane, θ2 is a contact angle between the top plate and the liquid, L2 is an inner circumferential length of the opening in the plane, Pf is a liquid pressure of the liquid which has partially entered the gap, γ is a surface tension of the liquid, and S is an area of the gap in the plane.

2. A device manufacturing method comprising:
  exposing a substrate to light using an exposure apparatus defined in claim 1; and developing the exposed substrate.

* * * * *